(12) United States Patent
Chang Chien et al.

(10) Patent No.: US 11,990,494 B2
(45) Date of Patent: May 21, 2024

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 280 days.

(21) Appl. No.: 17/383,376

(22) Filed: Jul. 22, 2021

(65) Prior Publication Data

US 2022/0045115 A1 Feb. 10, 2022

Related U.S. Application Data

(60) Provisional application No. 63/062,392, filed on Aug. 6, 2020.

(30) Foreign Application Priority Data

Jul. 5, 2021 (TW) .................................. 110124612

(51) Int. Cl.
*H01L 27/146* (2006.01)

(52) U.S. Cl.
CPC .. *H01L 27/14634* (2013.01); *H01L 27/14618* (2013.01); *H01L 27/1462* (2013.01);
(Continued)

(58) Field of Classification Search
CPC ......... H01L 27/14634; H01L 27/14618; H01L 27/14632; H01L 27/14687; H01L 27/1469
See application file for complete search history.

(56) References Cited

U.S. PATENT DOCUMENTS

| 9,935,148 B2 * | 4/2018 | Yiu | .................. | H01L 27/14636 |
| 10,056,419 B2 * | 8/2018 | Yiu | .................. | H01L 27/14634 |

(Continued)

FOREIGN PATENT DOCUMENTS

| TW | 201543641 | 11/2015 |
| TW | 201703220 | 1/2017 |

(Continued)

OTHER PUBLICATIONS

Office Action of Taiwan Counterpart Application, issued on Nov. 9, 2021, pp. 1-6.

(Continued)

*Primary Examiner* — Mounir S Amer
*Assistant Examiner* — Alexander Belousov
(74) *Attorney, Agent, or Firm* — JCIPRNET

(57) ABSTRACT

A package structure including a first die, a second die, an encapsulant, a dam structure, a light-transmitting sheet, a conductive connector, a circuit layer, and a conductive terminal is provided. The first die includes a first active surface. The first active surface has a sensing area. The second die is arranged such that a second back surface thereof faces the first die. The encapsulant covers the second die. The encapsulant has a first encapsulating surface and a second encapsulating surface. The dam structure is located on the first encapsulating surface and exposes the sensing area. The light-transmitting sheet is located on the dam structure. The conductive connector penetrates the encapsulant. The circuit layer is located on the second encapsulating surface. The first die is electrically connected to the second die through the conductive connector and the circuit layer. The conductive terminal is disposed on the circuit layer.

5 Claims, 10 Drawing Sheets

(52) U.S. Cl.
CPC .. *H01L 27/14632* (2013.01); *H01L 27/14636* (2013.01); *H01L 27/14643* (2013.01); *H01L 27/14685* (2013.01); *H01L 27/14687* (2013.01); *H01L 27/14689* (2013.01); *H01L 27/1469* (2013.01)

(56) References Cited

U.S. PATENT DOCUMENTS

| | | | | |
|---|---|---|---|---|
| 10,157,875 | B2* | 12/2018 | Yiu | H01L 24/94 |
| 10,446,504 | B2* | 10/2019 | Cheng | H01L 24/92 |
| 2015/0325557 | A1* | 11/2015 | Yiu | H01L 24/94 |
| | | | | 438/48 |
| 2017/0018590 | A1* | 1/2017 | Yiu | H01L 24/19 |
| 2017/0117242 | A1* | 4/2017 | Ho | H01L 24/11 |
| 2018/0175092 | A1* | 6/2018 | Yiu | H01L 27/14627 |
| 2018/0337142 | A1* | 11/2018 | Cheng | H01L 23/04 |
| 2019/0096866 | A1* | 3/2019 | Hsu | H01L 23/3135 |
| 2020/0091126 | A1* | 3/2020 | Lin | H01L 24/20 |

FOREIGN PATENT DOCUMENTS

| | | |
|---|---|---|
| TW | 201715662 | 5/2017 |
| TW | 201947679 | 12/2019 |

OTHER PUBLICATIONS

"Office Action of Taiwan Related Application, Application No. 111125215", issued on Nov. 7, 2022, p. 1-p. 7.

* cited by examiner

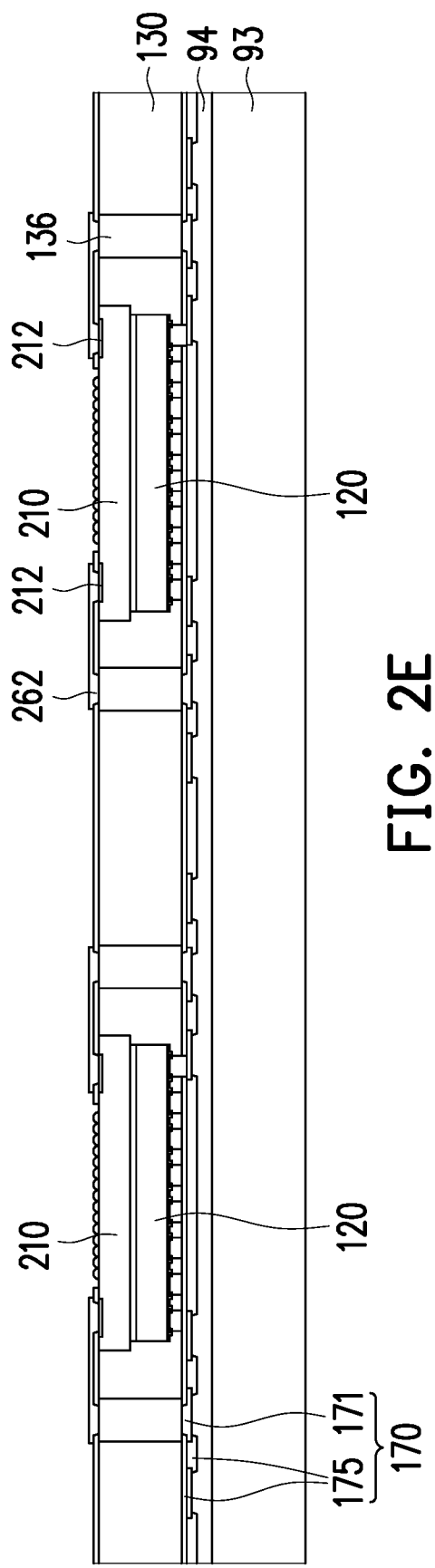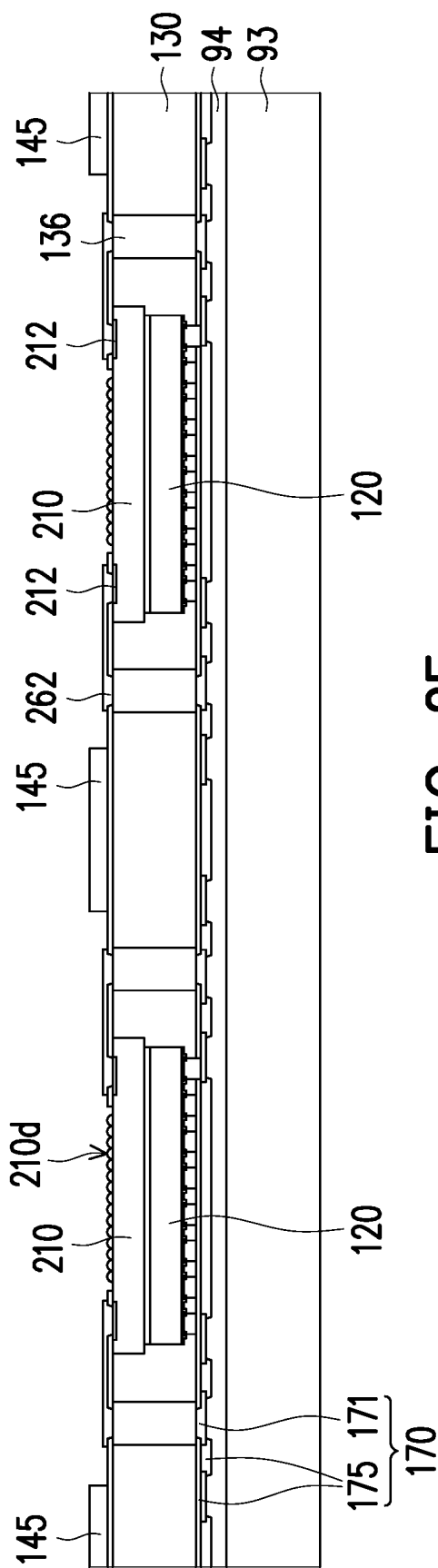

PACKAGE STRUCTURE AND MANUFACTURING METHOD THEREOF

CROSS-REFERENCE TO RELATED APPLICATION

This application claims the priority benefits of U.S. provisional application Ser. No. 63/062,392, filed on Aug. 6, 2020, and Taiwanese application no. 110124612, filed on Jul. 5, 2021. The entirety of each of the above-mentioned patent applications is hereby incorporated by reference herein and made a part of this specification.

BACKGROUND

Technical Field

The disclosure relates to a package structure and a manufacturing method thereof. More particularly, the disclosure relates to a package structure and a manufacturing method thereof, in which multiple dies are integrated.

Description of Related Art

To achieve a design of lightweight and miniature electronic products, the semiconductor packaging technology exhibits regular progresses to develop products that satisfy small size, light weight, high density, high competitiveness on the market, and other requirements. Accordingly, how to integrate multiple dies to improve efficiency of a package structure has become one of the important issues.

SUMMARY

The disclosure provides a package structure and a manufacturing method thereof, in which the performance may be improved.

In the disclosure, a package structure includes a first die, a second die, an encapsulant, a dam structure, a light-transmitting sheet, a conductive connector, a first circuit layer, and a conductive terminal. The first die includes a first active surface and a first back surface opposite to the first active surface. The first active surface has a sensing area. The second die includes a second active surface and a second back surface opposite to the second active surface. The second die is arranged such that the second back surface faces the first back surface of the first die. The encapsulant covers the second die. The encapsulant has a first encapsulating surface and a second encapsulating surface opposite to the first encapsulating surface. The dam structure is located on the first encapsulating surface and exposes the sensing area of the first die. The light-transmitting sheet is located on the dam structure. The conductive connector penetrates the encapsulant. The first circuit layer is located on the second encapsulating surface. The first die is electrically connected to the second die through the conductive connector and the first circuit layer. The conductive terminal is disposed on the first circuit layer.

In the disclosure, a manufacturing method of a package structure includes the following. A wafer is provided. The wafer includes an active surface. The active surface has a sensing area. A dam structure is formed on the active surface of the wafer. A light-transmitting sheet is disposed on the dam structure. A through silicon via is formed on the wafer, and a circuit layer electrically connected to the through silicon via is formed on a back surface of the wafer opposite to the active surface. A dielectric layer covering the through silicon via is formed. A conductive connector is formed on the dielectric layer. A second die is disposed on the dielectric layer. An encapsulant covering the second die is formed on the dielectric layer. A first circuit layer is formed on the encapsulant. The wafer is electrically connected to the second die through the conductive connector and the first circuit layer. A conductive terminal is formed on the first circuit layer.

In the disclosure, a manufacturing method of a package structure includes the following. A conductive connector is formed on a carrier. A first die is disposed on the carrier. The first die includes a first active surface and a first back surface opposite to the first active surface. The first active surface has a sensing area. The first die is arranged such that the first active surface faces the carrier. A second die is disposed on the first die. The second die includes a second active surface and a second back surface opposite to the second active surface. The second die is arranged such that the second back surface faces the first back surface of the first die. An encapsulant is formed on the carrier. The encapsulant covers the first die and the second die. A circuit layer is formed on the encapsulant. After the encapsulant is formed, the carrier and the first die are separated to expose the first active surface. A dam structure is formed on the encapsulant. The dam structure exposes the sensing area. A light-transmitting sheet is disposed on the dam structure.

Based on the foregoing, in the manufacturing method and the corresponding structure of the disclosure, the first die adapted for sensing and the second die adapted for data processing may be integrated into one package structure. Accordingly, the sensing and processing performance of the package structure may be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2H are schematic partial cross-sectional views of a manufacturing method of a package structure according to a second embodiment of the disclosure.

DESCRIPTION OF THE EMBODIMENTS

Figure 1A:
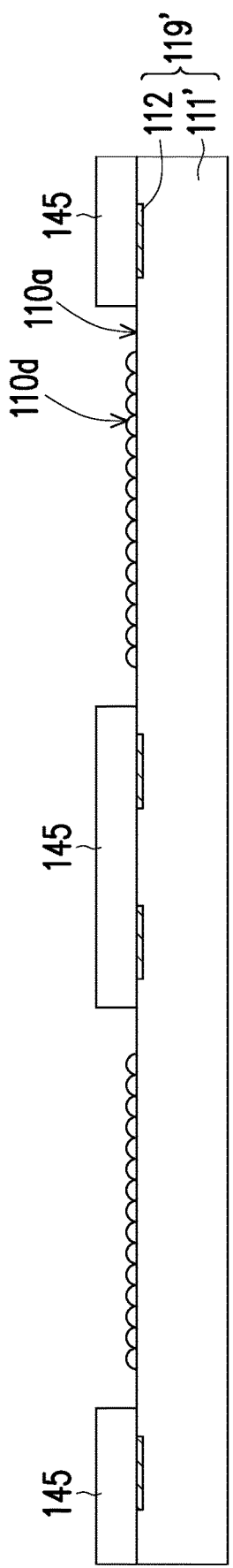
FIG. 1A to FIG. 1H are schematic partial cross-sectional views of a manufacturing method of a package structure according to a first embodiment of the disclosure.

Unless otherwise expressly stated, directional terms (e.g., up, down, left, right, front, back, top, and bottom) as used herein only serve to be made with reference to the figures as drawn and are not intended to imply absolute orientation. In addition, for clarity in the drawings, part of film layers or members may be omitted.

Unless otherwise expressly stated, it is in no way intended that any method set forth herein be construed as requiring that its steps be performed in a specific order.

The disclosure will be described more comprehensively with reference to the drawings. However, the disclosure may also be embodied in many different forms and should not be limited to the embodiments described herein. For clarity in the drawings, thicknesses, dimensions, or sizes of layers or regions may be enlarged. The same or similar elements will be denoted with the same or similar reference numerals, and will not be repeatedly described in the following paragraphs.

FIG. 1A to FIG. 1H are schematic partial cross-sectional views of a manufacturing method of a package structure according to a first embodiment of the disclosure.

With reference to FIG. 1A, a wafer 119' is provided. The wafer 119' may be placed on a carrier (not shown), but the disclosure is not limited thereto.

The wafer 119' may include a silicon substrate 111' and a plurality of die pads 112. The die pads 112 are, for example, aluminum pads, copper pads, or other suitable metal pads, but the disclosure is not limited thereto.

An element area (not shown) is present on one side of the substrate 111', and the surface where the element area is located may be referred to as an active surface 110a. The die pads 112 may be located on the active surface 110a. In a general die design, elements in an element area (e.g., elements in the element area of the wafer 119') may be electrically connected to corresponding die pads (e.g., part of the die pads 112 in the wafer 119') through a corresponding back end of line interconnect (BEOL interconnect). The active surface 110a has a sensing area 110d. The sensing area 110d may have corresponding sensing elements. The sensing element is, for example, a complementary metal oxide semiconductor (CMOS) image sensor (CIS), but the disclosure is not limited thereto.

With further reference to FIG. 1A, an insulating dam structure 145 is formed on the active surface 110a of the wafer 119'. The dam structure 145 may be formed by coating, printing, exposure and development, or other suitable ways, which is not limited by the disclosure.

Figure 1B:
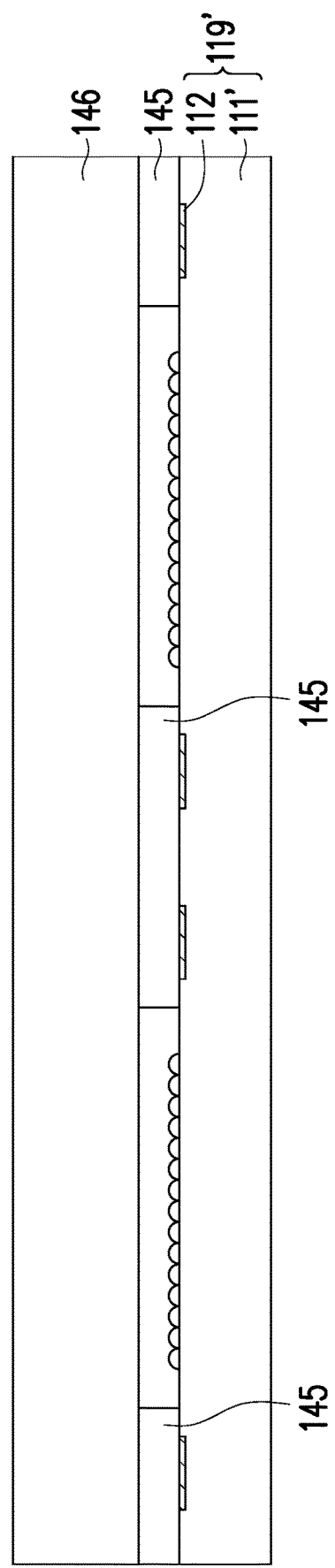

With reference to FIG. 1A to FIG. 1B, a light-transmitting sheet 146 is disposed on the dam structure 145.

In this embodiment, the step of disposing the light-transmitting sheet 146 on the dam structure 145 may be performed under a first ambient pressure. For example, the step of disposing the light-transmitting sheet 146 on the dam structure 145 may be performed in a cavity (not shown), and the cavity has the corresponding first ambient pressure.

In an embodiment, the first ambient pressure is less than one atmospheric pressure. Accordingly, in subsequent steps or structures, an air pressure difference may cause a closer contact between the light-transmitting sheet 146 and the dam structure 145.

Figure 1C:
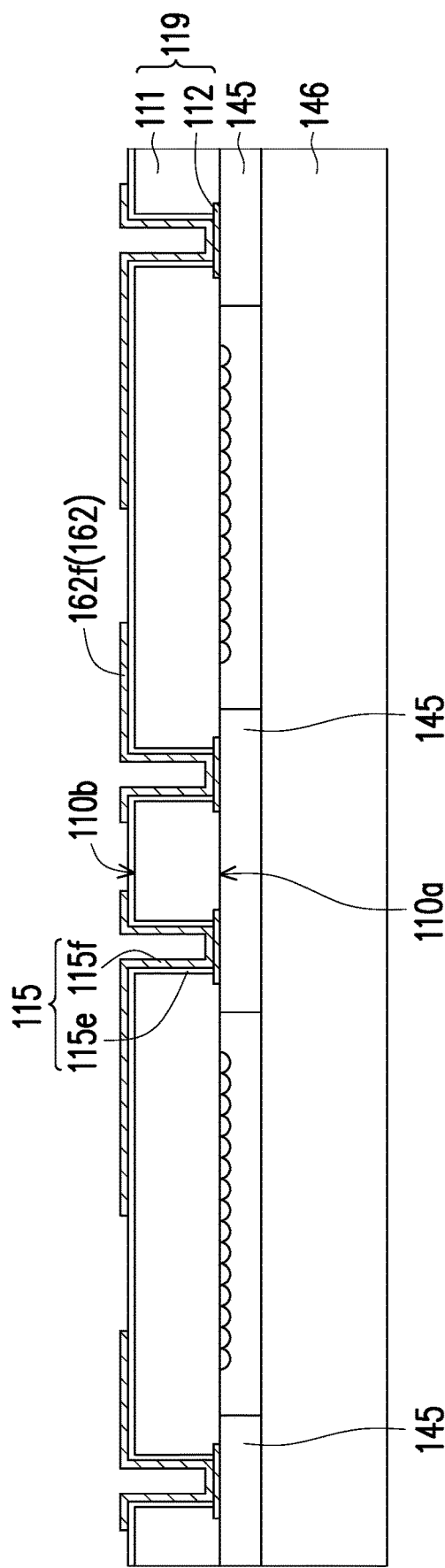

With reference to FIG. 1B to FIG. 1C, a through silicon via (TSV) 115 is formed on a wafer 119 (labeled in FIG. 1C), and a circuit layer 162 electrically connected to the through silicon via 115 is formed on a back surface 110b of the wafer 119 opposite to the active surface 110a.

In this embodiment, a thinning process may be performed on the silicon substrate 111' (labeled in FIG. 1B) of the wafer 119'. Then, the through silicon via 115 and the corresponding circuit layer 162 (may be referred to as a second circuit layer) are formed on the back surface 110b of a thinned silicon substrate 111 (labeled in FIG. 1C).

For example, the thinning process may first be performed on the silicon substrate 111' (labeled in FIG. 1B). Then, an opening exposing the die pad 112 may be formed on the back surface 110b of the thinned silicon substrate 111 (labeled in FIG. 1C) by etching or other suitable ways. Then, a corresponding insulating layer 115e may be formed by deposition, etching, and/or other suitable ways. The insulating layer 115e may cover the back surface 110b of the substrate 111 and the sidewall of the opening, and the insulating layer 115e may expose the die pad 112. Then, corresponding conductive layers 115f and 162f may be formed by deposition, plating, etching, and/or other suitable ways. The conductive layers 115f and 162f include, for example, corresponding seed layers and corresponding plating layers, but the disclosure is not limited thereto. Part of the conductive layer 115f and the corresponding insulating layer 115e located in the opening may be referred to as the through silicon via 115. Part of the conductive layer 162f located on the back surface 110b of the substrate 111 may be referred to as the circuit layer 162. In other words, the conductive part of the through silicon via 115 and the conductive part of the circuit layer 162 may be the same film layer. In addition, the layout design in the circuit layer 162 may be adjusted depending on design requirements, which is not limited by the disclosure.

In this embodiment, the insulating layer 115e and the conductive layer 115f do not completely fill up the opening exposing the die pad 112.

Figure 1D:
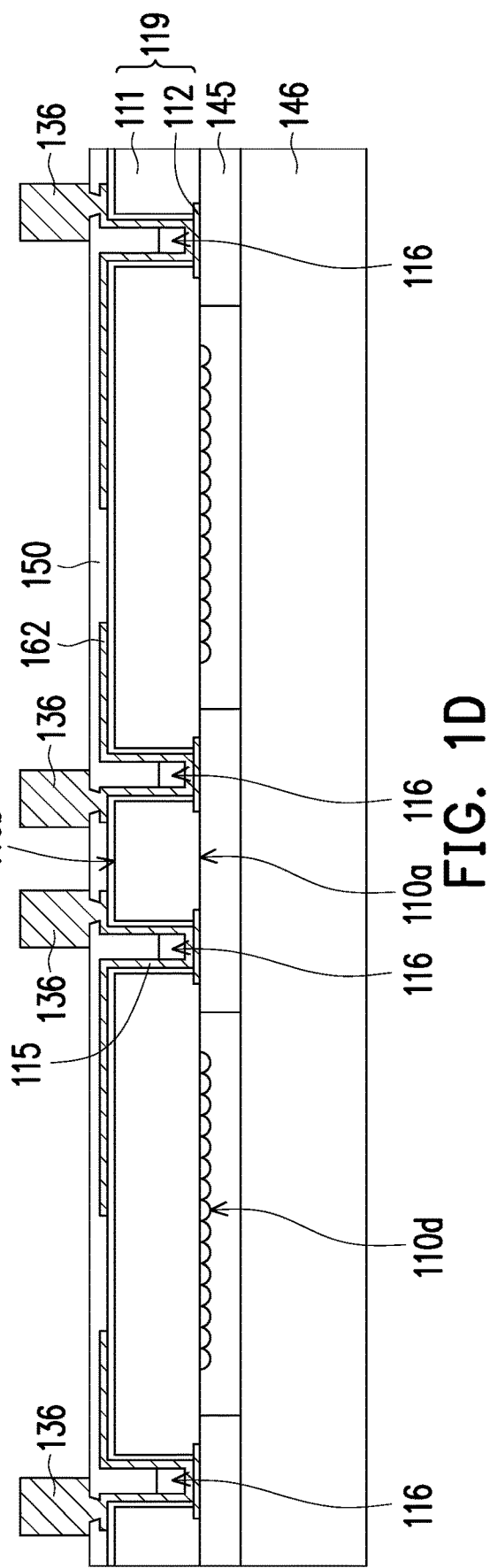

With reference to FIG. 1C to FIG. 1D, a dielectric layer 150 is formed. The dielectric layer 150 may cover the through silicon via 115 and expose part of the circuit layer 162. In this embodiment, a corresponding organic dielectric material (for example, but not limited to, polyimide (PI)) may be formed on the back surface 110b of the substrate 111 by coating. Then, the organic dielectric material may be formed into a patterned dielectric layer 150 by proper curing (e.g., lighting, heating, and/or standing for a period of time).

In this embodiment, it is possible that the patterned dielectric layer 150 is partially filled in and does not completely fill up the opening of the substrate 111. In other words, at least one gas gap 116 is embedded in the through silicon via 115. For example, the step of forming the dielectric layer 150 covering the through silicon via 115 (e.g., the step of forming the organic dielectric material on the back surface of the substrate) may be performed under a second ambient pressure. The second ambient pressure is, for example, room pressure (e.g., about one atmospheric pressure). Accordingly, the dielectric layer 150 may be formed relatively easily and/or quickly. In other words, in the above manner, the pressure in the gas gap 116 is also substantially the second ambient pressure.

In an embodiment, the organic dielectric material for forming the dielectric layer 150 may be dissolved in a suitable solvent, or may be formed during a suitable reaction (e.g., a condensation polymerization) in a suitable solvent. The solvent is, for example, dimethylformamide, dimethyl sulfoxide (DMSO), or other suitable organic solvents. Accordingly, during the process of forming the dielectric layer 150 (e.g., during the curing step), part of the organic solvent molecules may remain in the gas gap 116.

In an embodiment, the dielectric layer 150 may be referred to as a passivation layer, but the disclosure is not limited thereto.

With further reference to FIG. 1D, a conductive connector 136 is formed on the dielectric layer 150. The conductive connector 136 may be electrically connected to the corresponding circuit in the circuit layer 162.

In an embodiment, the conductive connector 136 may be formed in a suitable way (for example, but not limited to, exposure development and plating), but the disclosure is not limited thereto. In an embodiment, the conductive connector 136 may be a pre-formed conductive member.

Figure 1E:
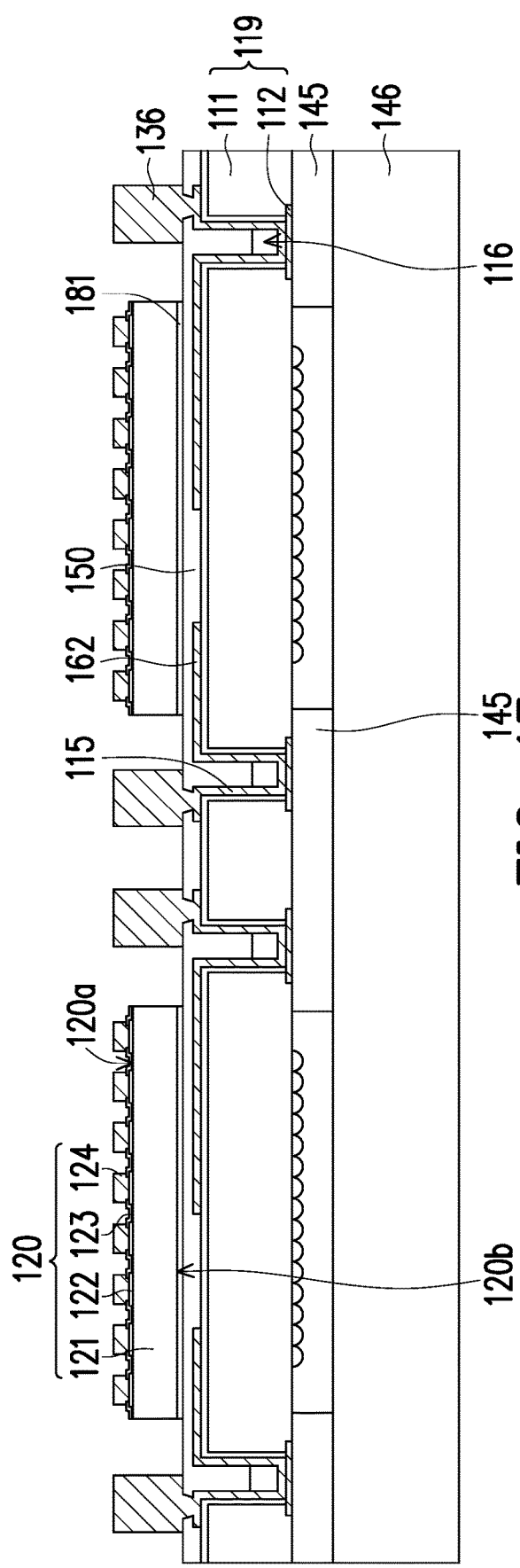

With reference to FIG. 1E, a second die 120 is disposed on the dielectric layer 150. In this embodiment, the second die 120 may include a silicon substrate 121, a plurality of die pads 122, a die insulating layer 123, and a plurality of die connectors 124. An element area (not shown) is present on one side of the silicon substrate 121, and the surface where the element area is located may be referred to as a second active surface 120a. The surface opposite to the second active surface 120a may be referred to as a second back surface 120b. The second die 120 is arranged such that the second back surface 120b faces the wafer 119. The die pads 122 may be located on the second active surface 120a. The die connectors 124 are, for example, metal bumps, but the disclosure is not limited thereto. The die connectors 124 are located on and electrically connected to the corresponding die pads 122. The die insulating layer 123 may cover the die pads 122, and the die insulating layer 123 may expose part of the die pads 122. In a die design, elements in an element area (e.g., elements in the element area of the second die 120) may be electrically connected to corresponding die pads (e.g., part of the die pads 122 of the second die 120) through a corresponding back end of line interconnect.

In an embodiment, the second die 120 may include an image signal processor (ISP), but the disclosure is not limited thereto.

Notably, in the embodiment as shown, the conductive connector 136 is first formed on the dielectric layer 150, and then the second die 120 is disposed on the dielectric layer 150, but the disclosure is not limited thereto. In an embodiment not shown, it is possible that the second die 120 is first disposed on the dielectric layer 150, and then the conductive connector 136 is formed on the dielectric layer 150.

In an embodiment, the second back surface 120b of the second die 120 may have an adhesive material 181 thereon. The adhesive material 181 may include a die attached film (DAF), but the disclosure is not limited thereto.

Figure 1F:
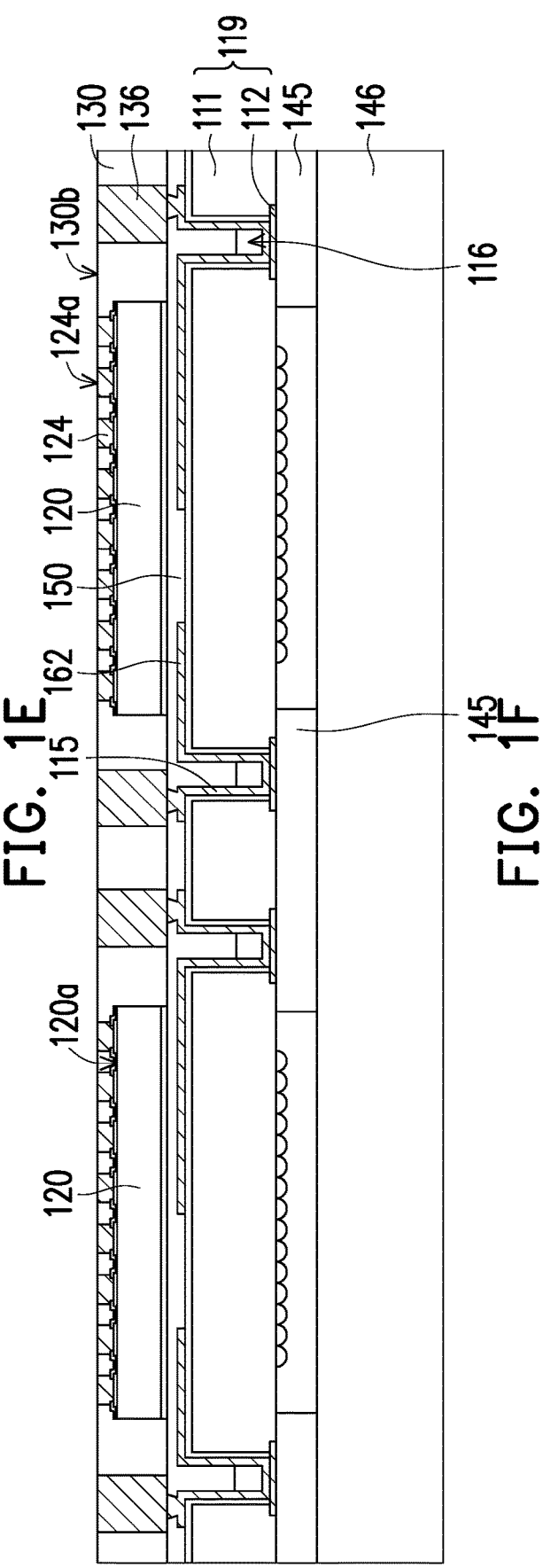

With reference to FIG. 1E to FIG. 1F, an encapsulant 130 is formed on the dielectric layer 150. The encapsulant 130 may cover the second die 120.

In an embodiment, a molding material (not shown) may be formed on the dielectric layer 150. Moreover, after the molding material is cured, a flattening process may be performed to form the encapsulant 130. The flattening process may be, for example, grinding, polishing, or other suitable steps of flattening. The encapsulant 130 may expose an upper surface 124a of the die connectors 124 of the second die 120. That is, an encapsulating surface 130b of the encapsulant 130 may be coplanar with the upper surface 124a of the die connectors 124 of the second die 120.

In an embodiment, since the second active surface 120a of the second die 120 has the die connectors 124 thereon, during the step of flattening, the possibility of causing damage to the second active surface 120a of the second die 120 may be reduced.

Figure 1G:
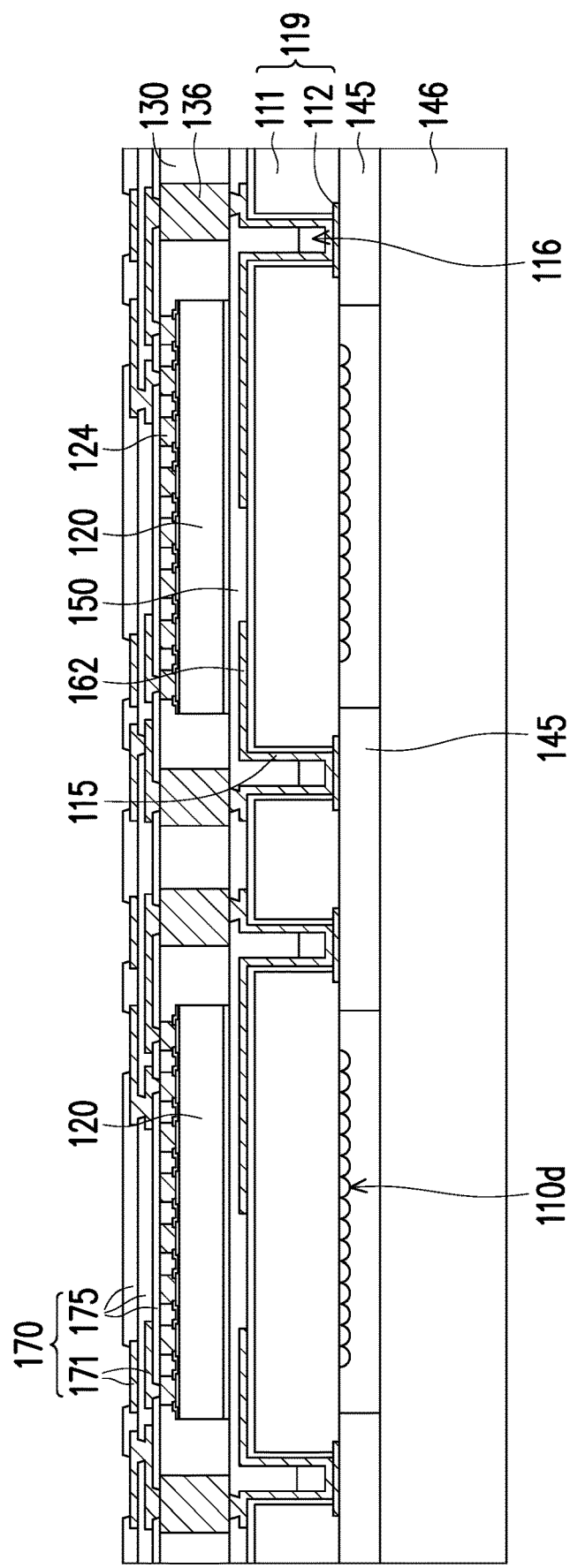

With reference to FIG. 1F to FIG. 1G, a redistribution circuit structure 170 is formed on the encapsulant 130. The redistribution circuit structure 170 includes a corresponding conductive layer 171 (may be referred to as a first circuit layer) and a corresponding insulating layer 175. The conductive layer 171 penetrating the insulating layer 175 may be referred to as a conductive via. The layout design of the circuit formed by the conductive layer 171 may be adjusted depending on design requirements, which is not limited by the disclosure. The device of the wafer 119 and the second die 120 may be electrically connected by the corresponding circuit in the redistribution circuit structure 170, the corresponding conductive connector 136 and the corresponding circuit in the first circuit layer 171.

Figure 1H:
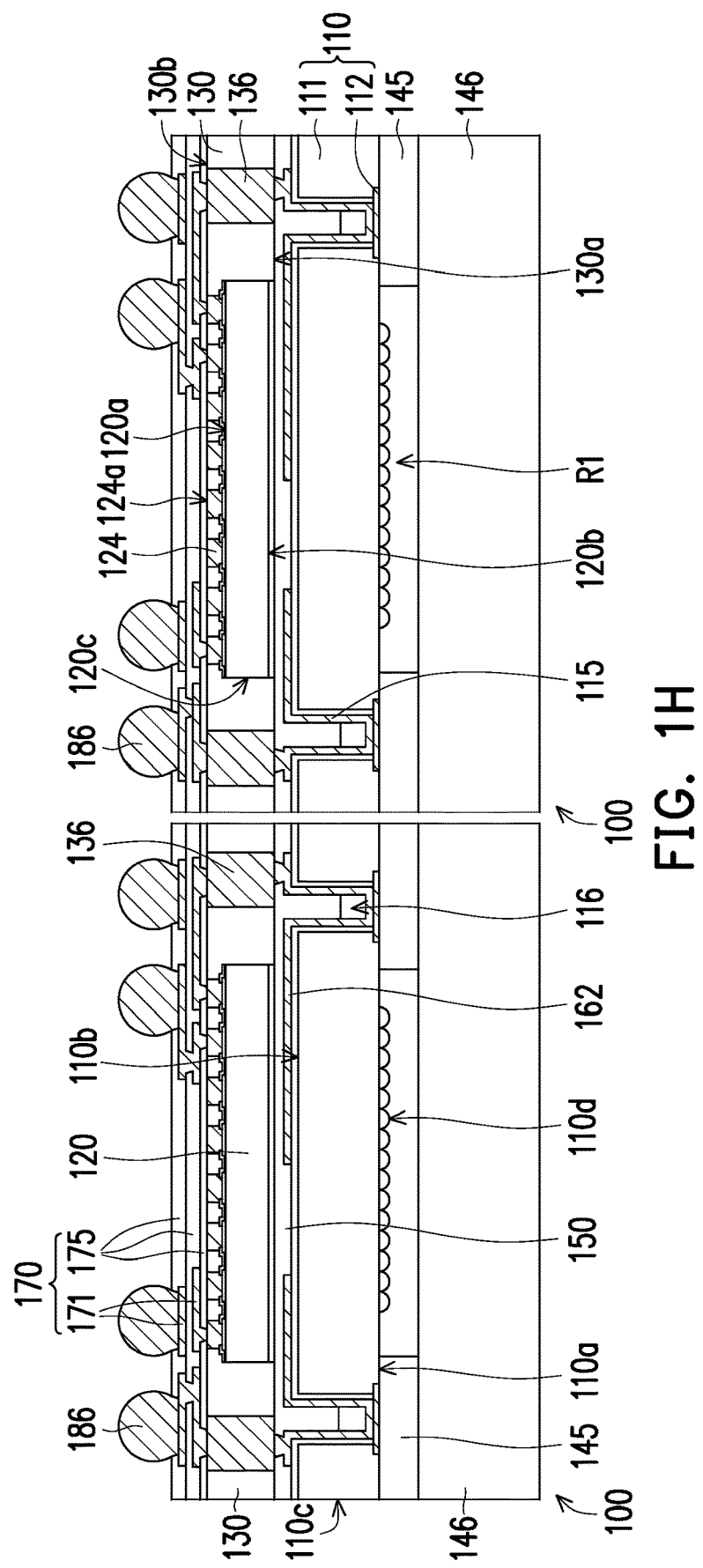

With reference to FIG. 1G to FIG. 1H, a conductive terminal 186 is formed on the first circuit layer 171 and is electrically connected to the corresponding circuit in the first circuit layer 171. The conductive terminal 186 may include solder balls, but the disclosure is not limited thereto.

With further reference to FIG. 1G to FIG. 1H, a singulation process may be performed to obtain a plurality of first dies 110. The singulation process includes, for example, cutting the wafer 119 (labeled in FIG. 1G) with a rotating blade or a laser beam. In an embodiment, the singulation process may be performed further on the redistribution circuit structure 170, the encapsulant 130, the dam structure 145, and/or the light-transmitting sheet 146.

Notably, after the singulation process is performed, similar reference numerals will be used for the elements after singulation. For example, the corresponding structure (e.g., the sensing area 110d, the silicon via 115, the gas gap 116, or the like in FIG. 1G) in the wafer 119 after singulation may be the corresponding structure in the plurality of first dies 110 (e.g., the sensing areas 110d, the silicon vias 115, the gas gaps 116, or the like in FIG. 1H), the second die 120 (as shown in FIG. 1G) after singulation may be a plurality of second dies 120 (as shown in FIG. 1H), the encapsulant 130 (shown in FIG. 1G) after singulation may be a plurality of encapsulants 130 (shown in FIG. 1H), the dam structure 145 (shown in FIG. 1G) after singulation may be a plurality of dam structures 145 (shown in FIG. 1H), the light-transmitting sheet 146 (shown in FIG. 1G) after singulation may be a plurality of light-transmitting sheets 146 (shown in FIG. 1H), and so on. The other elements after singulation will similarly follow the above rule of reference numerals, and will not be repeatedly described herein. In addition, for clarity, not all of the elements are each labeled in FIG. 1H.

Notably, in the embodiment as shown, the conductive terminal 186 is first formed, and then the singulation process is performed, but the disclosure is not limited thereto. In an embodiment not shown, it is possible that the singulation process is first performed, and then the conductive terminal 186 is formed.

With reference to FIG. 1H, after the above process, the manufacturing of a package structure 100 of this embodiment may be substantially completed. The package structure 100 includes the first die 110, the second die 120, the encapsulant 130, the dam structure 145, the light-transmitting sheet 146, the conductive connector 136, the first circuit layer 171, and the conductive terminal 186. The first die 110 includes the first active surface 110a, the first back surface 110b, and a first side surface 110c. The first back surface 110b is opposite to the first active surface 110a. The first side surface 110c connects the first active surface 110a and the first back surface 110b. The first active surface 110a has the sensing area 110d. The second die 120 includes the second active surface 120a, the second back surface 120b, and a second side surface 120c. The second back surface 120b is opposite to the second active surface 120a. The second side surface 120c connects the second active surface 120a and the second back surface 120b. The second die 120 is arranged such that the second back surface 120b faces the first back surface 110b of the first die 110. The encapsulant 130 covers the second side surface 120c and/or part of the second active surface 120a of the second die 120. The encapsulant 130 has a first encapsulating surface 130a and a second encapsulating surface 130b opposite to the first encapsulating surface 130a. The dam structure 145 is located on the first encapsulating surface 130a, or further located on the first active surface 110a of the first die 110. The dam structure 145 exposes the sensing area 110d of the first die 110. The light-transmitting sheet 146 is located on the dam structure 145. The conductive connector 136 penetrates the encapsulant 130. The first circuit layer 171 is located on the second encapsulating surface 130b. The first die 110 is electrically connected to the second die 120 through the conductive connector 136 and the first circuit layer 171. The conductive terminal 186 is disposed on the first circuit layer 171.

In this embodiment, the second active surface 120a of the second die 120 further has the die connectors 124 thereon. The surface 124a of the die connectors 124 is a coplanar with the second encapsulating surface 130b.

In this embodiment, the package structure 100 further includes the second circuit layer 162. The second circuit layer 162 is located on the first encapsulating surface 130a. The first die 110 is electrically connected to the second die 120 through the second circuit layer 162, the conductive connector 136, and the first circuit layer 171.

In this embodiment, the first die 110 further includes the through silicon via 115, and the through silicon via 115 of the first die 110 is electrically connected to the second circuit layer 162.

In this embodiment, the second circuit layer 162 is further located between the first die 110 and the second die 120.

In this embodiment, the package structure 100 further includes the dielectric layer 150. The dielectric layer 150 is located on the second circuit layer 162 and covers the through silicon via 115. The at least one gas gap 116 is embedded in the through silicon via 115. In an embodiment, the gas gaps 116 located in different through silicon vias 115 may have different sizes and/or shapes.

In this embodiment, the first die 110, the dam structure 145, and the light-transmitting sheet 146 form an enclosed space R1. In an embodiment, an air pressure in the gas gap 116 is greater than or equal to an air pressure in the enclosed space R1. In an embodiment, the air pressure in the enclosed space R1 is less than one atmospheric pressure.

FIG. 2A to FIG. 2H are schematic partial cross-sectional views of a manufacturing method of a package structure according to a second embodiment of the disclosure.

Figure 2A:
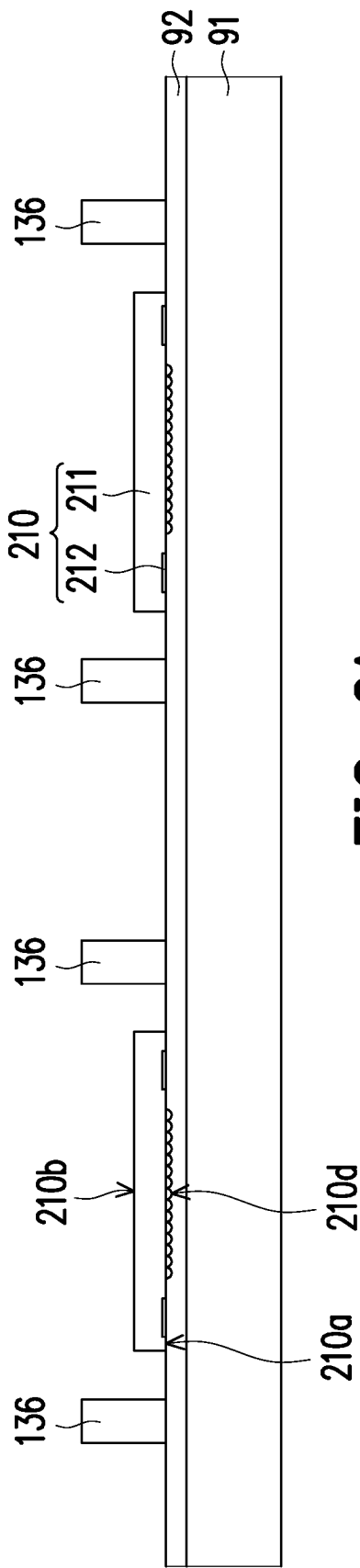

With reference to FIG. 2A, a first carrier 91 is provided. In the disclosure, the first carrier 91 is not particularly limited, as long as the first carrier 91 may be adapted for carrying the film layers formed thereon or the elements disposed thereon.

In this embodiment, the first carrier 91 may have a release layer 92 thereon, but the disclosure is not limited thereto. The release layer 92 is, for example, a light to heat conversion (LTHC) adhesive layer or other similar film layers, but the disclosure is not limited thereto.

With further reference to FIG. 2A, the conductive connector 136 is formed on the first carrier 91.

With further reference to FIG. 2A, a first die 210 is disposed on the first carrier 91. The first die 210 includes a first active surface 210a and a first back surface 210b opposite to the first active surface 210a. The first active surface 210a has a sensing area 210d. The first die 210 may include a silicon substrate 211 and a plurality of die pads 212. The die pads 212 may be located on the active surface 210a. The first die 210 is arranged such that the first active surface 210a faces the first carrier 91.

Notably, in the disclosure, the step of forming the conductive connector 136 and the step of disposing the first die 210 are not limited to any sequence.

Figure 2B:
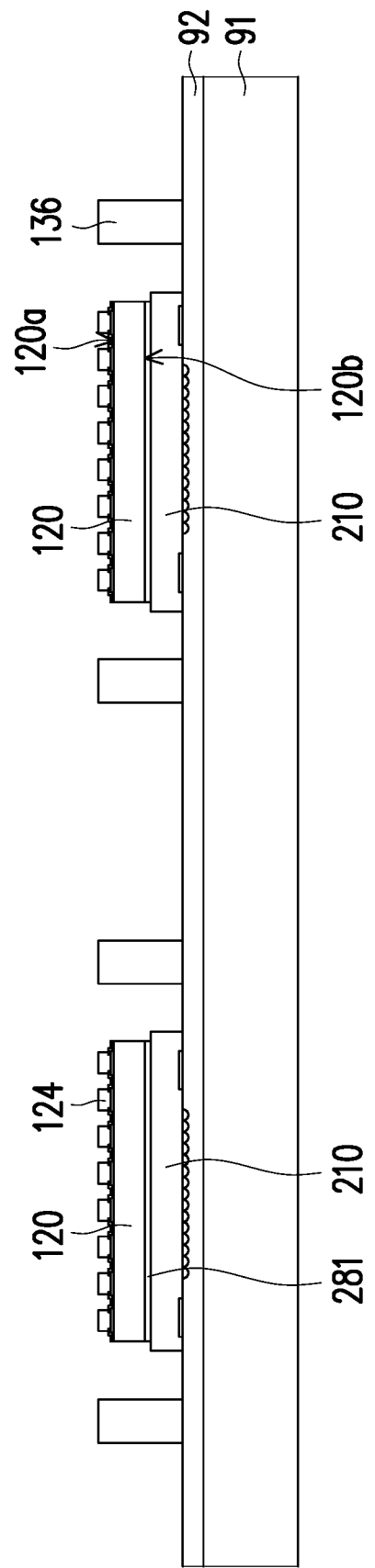

With reference to FIG. 2A to FIG. 2B, the second die 120 is disposed on the first die 210. The second die 120 is arranged such that the second back surface 120b faces the first back surface 210b of the first die 210.

In an embodiment, an adhesive material 281 may be present between the first back surface 210b of the first die 210 and the second back surface 120b of the second die 120.

The adhesive material 281 may include a die attached film, but the disclosure is not limited thereto.

Notably, in the disclosure, the step of forming the conductive connector 136 and the step of disposing the second die 120 are not limited to any sequence.

Notably, in the embodiment as shown, the conductive connector 136 is first formed, and then the second die 120 is disposed on the first die 210, but the disclosure is not limited thereto. In an embodiment not shown, it is possible that the second die 120 is first disposed on the first die 210, and then the conductive connector 136 is formed.

Figure 2C:
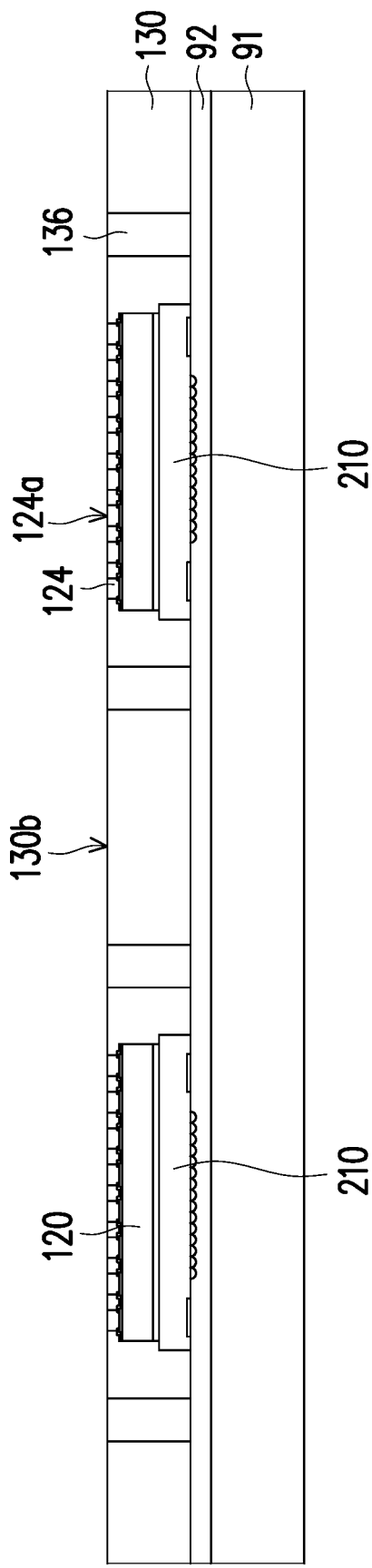

With reference to FIG. 2B to FIG. 2C, the encapsulant 130 is formed on the first carrier 91, and the encapsulant 130 covers the first die 210 and the second die 120. The encapsulant 130 may expose the upper surface 124a of the die connectors 124 of the second die 120.

Notably, in the embodiment as shown, the conductive connector 136 is first formed, and then the encapsulant 130 covering the first die 210 and the second die 120 is formed, but the disclosure is not limited thereto. In an embodiment not shown, it is possible that the encapsulant 130 covering the first die 210 and the second die 120 is first formed, and then the conductive connector 136 penetrating the encapsulant 130 is formed by, for example, drilling/etching and plating.

Figure 2D:
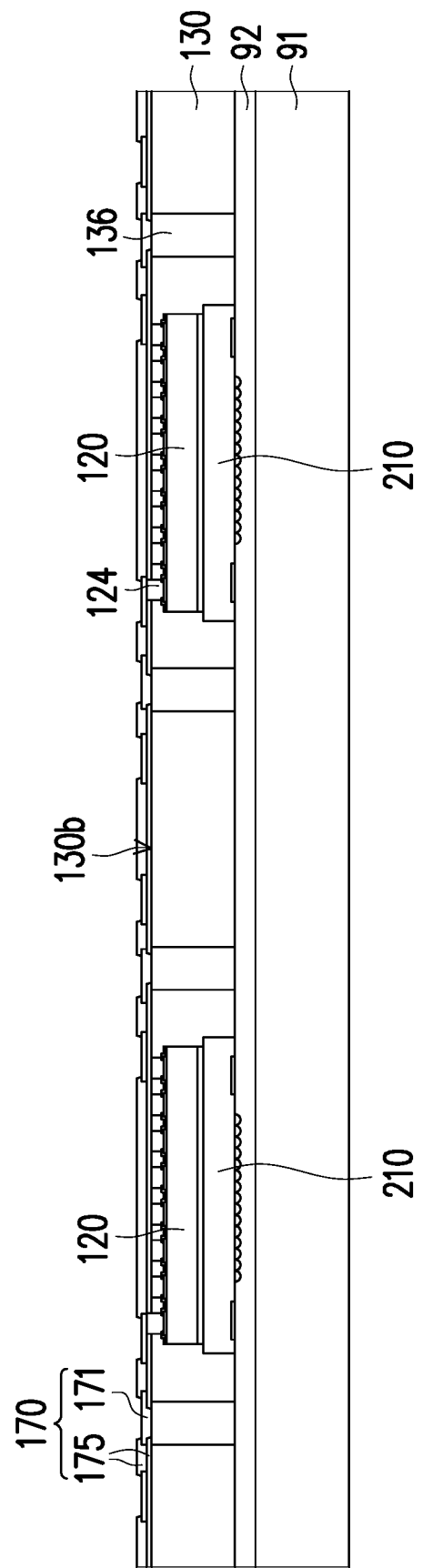

With reference to FIG. 2C to FIG. 2D, the redistribution circuit structure 170 is formed on the encapsulant 130. The corresponding circuit may in the redistribution circuit structure 170 may be electrically connected to the corresponding conductive connector 136 and/or the second die 120.

With reference to FIG. 2D to FIG. 2E, after the encapsulant 130 is formed, the structure as shown in FIG. 2D may be flipped upside down and placed on a second carrier 93 (labeled in FIG. 2E), which is not limited to any sequence. Then, the first carrier 91 (labeled in FIG. 2D) is separated from the first die 210 to expose the first active surface 210a of the first die 210, forming the structure as shown in FIG. 2E.

In the disclosure, the second carrier 93 is not particularly limited, as long as the second carrier 93 may be adapted for carrying the film layers formed thereon or the elements disposed thereon. In this embodiment, the second carrier 93 may have a release layer 94 thereon, but the disclosure is not limited thereto.

With further reference to FIG. 2E, a second circuit layer 262 is formed on the encapsulant 130. The corresponding circuit of the second circuit layer 262 may be electrically connected to the corresponding die pad 212. Therefore, the first die 210 and the second die 120 may be electrically connected by the corresponding circuit in the redistribution circuit structure 170, the conductive connector 136, and the second circuit layer 262.

With reference to FIG. 2E to FIG. 2F, the dam structure 145 is formed on the encapsulant 130. The dam structure 145 exposes the sensing area 210d in the first active surface 210a.

Figure 2G:
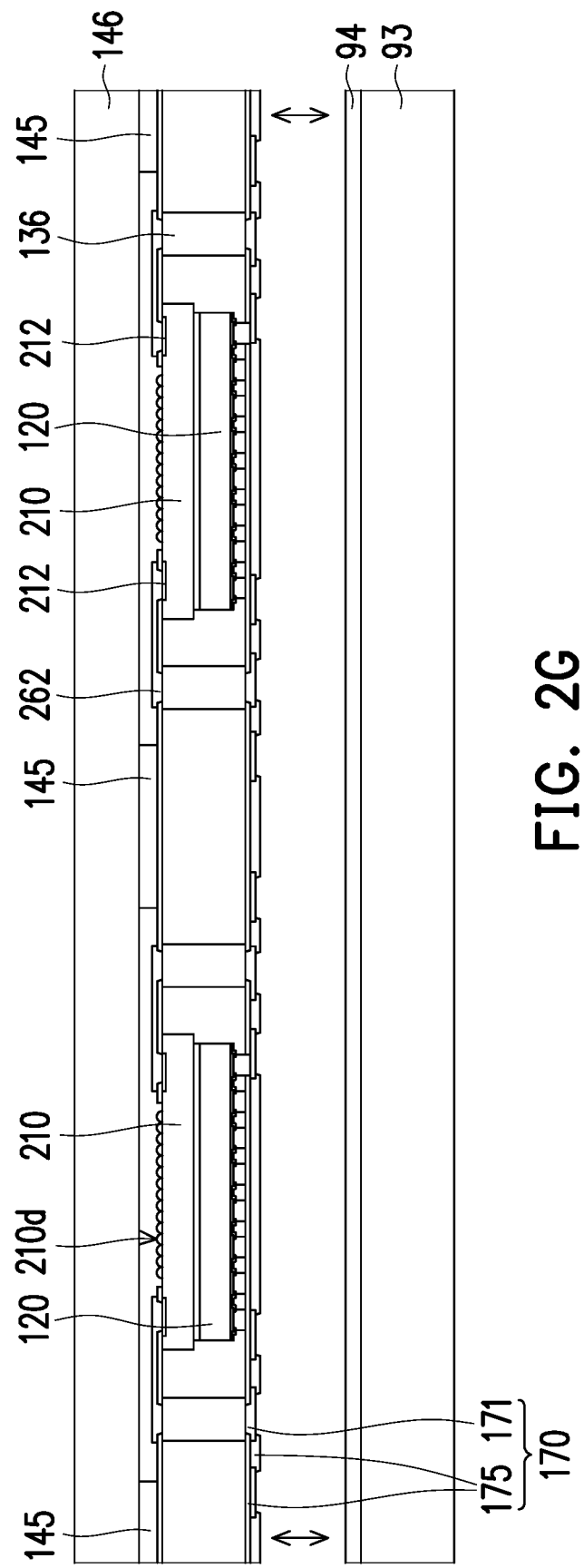

With reference to FIG. 2F to FIG. 2G, the light-transmitting sheet 146 is disposed on the dam structure 145. Then, the second carrier 93 is separated from the redistribution circuit structure.

Notably, in the embodiment as shown, the light-transmitting sheet 146 is first disposed on the dam structure 145, and then the second carrier 93 is separated from the redistribution circuit structure, but the disclosure is not limited thereto.

Figure 2H:
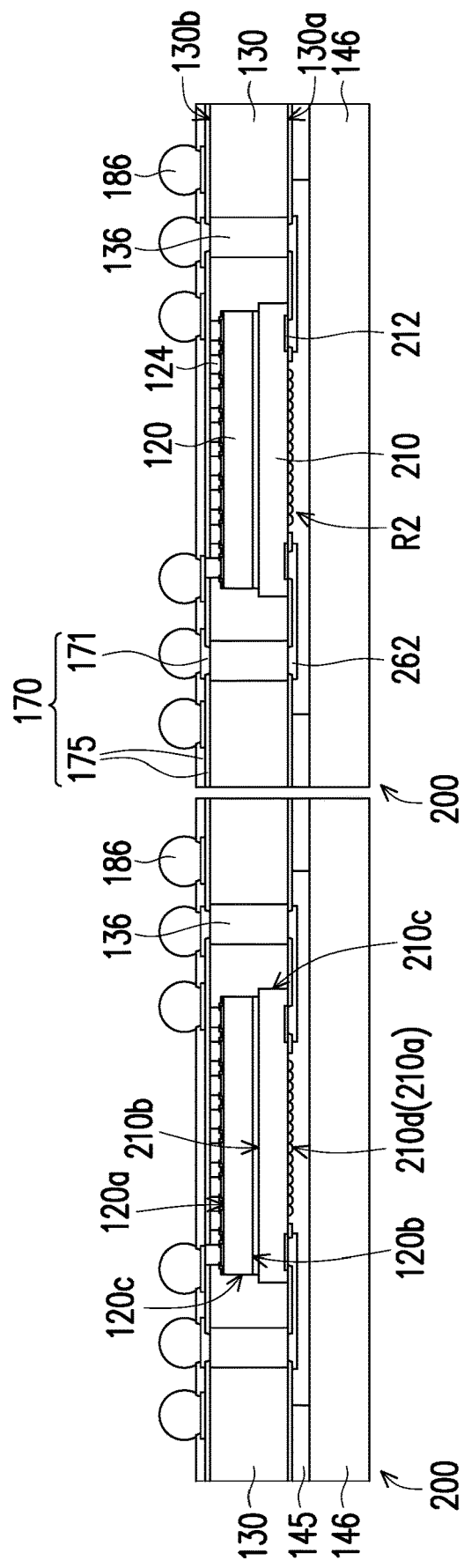

With reference to FIG. 2G to FIG. 2H, the conductive terminal 186 is formed on the first circuit layer 171 and is electrically connected to the corresponding circuit in the first circuit layer 171.

With reference to FIG. 2G to FIG. 2H, a singulation process may be performed on at least the structures shown in FIG. 2G. Notably, after the singulation process is performed, similar reference numerals will be used for the elements after singulation, and will not be repeatedly described herein. In addition, for clarity, not all of the elements are each labeled in FIG. 2H.

Notably, in the disclosure, the step of forming the conductive terminal 186 and the singulation process are not limited to any sequence.

Notably, in the embodiment as shown, it is possible that the second carrier 93 is first separated from the redistribution circuit structure, and then the singulation process is performed, but the disclosure is not limited thereto. In an embodiment not shown, it is possible that the singulation process is first performed, and then the second carrier 93 is separated from the plurality of structures after singulation.

With reference to FIG. 2H, after the above process, the manufacturing of a package structure 200 of this embodiment may be substantially completed. The package structure 200 includes the first die 210, the second die 120, the encapsulant 130, the dam structure 145, the light-transmitting sheet 146, the conductive connector 136, the first circuit layer 171, and the conductive terminal 186. The first die 210 includes the first active surface 210a, the first back surface 210b, and a first side surface 210c. The first back surface 210b is opposite to the first active surface 210a. The first side surface 210c connects the first active surface 210a and the first back surface 210b. The first active surface 210a has the sensing area 210d. The second die 120 is arranged such that the second back surface 120b faces the first back surface 210b of the first die 210. The encapsulant 130 covers the first die 210 and the second die 120. The dam structure 145 exposes the sensing area 210d of the first die 210. The first die 210 is electrically connected to the second die 120 through the conductive connector 136 and the first circuit layer 171. The conductive terminal 186 is disposed on the first circuit layer 171.

In this embodiment, the package structure 200 further includes the second circuit layer 262. The second circuit layer 262 is located on the first encapsulating surface 130a. The dam structure 145 may further expose the second circuit layer 262. The first die 210 is electrically connected to the second die 120 through the second circuit layer 262, the conductive connector 136, and the first circuit layer 171. The first die 210, the second circuit layer 262, the dam structure 145, and the light-transmitting sheet 146 form an enclosed space R2.

In summary of the foregoing, in the manufacturing method and the corresponding structure of the disclosure, the first die adapted for sensing and the second die adapted for data processing may be integrated into one package structure. Accordingly, the sensing and processing performance of the package structure may be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
   a first die, comprising a silicon substrate and a die pad, wherein the first die has a first active surface and a first back surface opposite to the first active surface, wherein the first active surface has a sensing area, the die pad is located on the active surface;
   a second die, comprising a second active surface and a second back surface opposite to the second active surface, wherein the second die is arranged such that the second back surface faces the first back surface of the first die;
   an encapsulant, covering the second die and having a first encapsulating surface and a second encapsulating surface opposite to the first encapsulating surface;
   a dam structure, located on the first encapsulating surface and exposing the sensing area of the first die;
   a light-transmitting sheet, located on the dam structure;
   a conductive connector, penetrating the encapsulant;
   a first circuit layer, located on the second encapsulating surface;
   an insulating layer, located on the first back surface of the first die and extendedly penetrating the silicon substrate to directly cover a portion of the die pad;
   a conductive layer, located on the insulating layer and extendedly penetrating the silicon substrate to in contact with a portion of the die pad exposed by the insulating layer,
      wherein a portion of the conductive layer located on the first back surface of the first die forms a second circuit layer located on the first encapsulating surface,
      wherein a portion of the insulating layer penetrating the silicon substrate and a portion of the conductive layer penetrating the silicon substrate forms a through silicon,
      wherein the die pad of the first die is electrically connected to the second die through the through silicon via, the second circuit layer, the conductive connector and the first circuit layer;
   a dielectric layer, located on the second circuit layer and covering the through silicon via,
      wherein a portion of the dielectric layer is embedded in the silicon substrate,
      wherein the portion of the dielectric layer embedded in the silicon substrate and the portion of the conductive layer forming the through silicon via form a gas gap; and
   a conductive terminal, disposed on the first circuit layer.

2. The package structure according to claim 1, wherein the second active surface of the second die further has a die connector, and a surface of the die connector is coplanar with the second encapsulating surface.

3. The package structure according to claim 1, wherein the second circuit layer is further located between the first die and the second die.

4. The package structure according to claim 1, wherein the first die, the dam structure, and the light-transmitting sheet form an enclosed space, and an air pressure in the gas gap is greater than or equal to an air pressure in the enclosed space.

5. The package structure according to claim 1, wherein the first die, the dam structure, and the light-transmitting sheet form an enclosed space, and an air pressure in the enclosed space is less than one atmospheric pressure.

* * * * *